United States Patent [19]

Widmann et al.

[11] Patent Number: 4,562,640

[45] Date of Patent: Jan. 7, 1986

[54] METHOD OF MANUFACTURING STABLE, LOW RESISTANCE CONTACTS IN INTEGRATED SEMICONDUCTOR CIRCUITS

[75] Inventors: Dietrich Widmann, Unterhaching; Reiner Sigusch, Munich, both of Fed. Rep. of Germany

[73] Assignee: Siemens Aktiengesellschaft, Berlin & Munich, Fed. Rep. of Germany

[21] Appl. No.: 592,402

[22] Filed: Mar. 22, 1984

[30] Foreign Application Priority Data

Apr. 25, 1983 [DE] Fed. Rep. of Germany ....... 3314879

[51] Int. Cl.[4] ........................................... H01L 21/285
[52] U.S. Cl. ....................................... 29/591; 29/590; 29/589; 148/DIG. 19
[58] Field of Search ......................... 29/589, 590, 591; 148/DIG. 19, DIG. 20, 133, 138, 115; 357/675, 715

[56] References Cited

U.S. PATENT DOCUMENTS

| | | | |
|---|---|---|---|
| 4,141,022 | 2/1979 | Sigg et al. | 29/591 |
| 4,187,599 | 2/1980 | Flowers et al. | 29/590 |
| 4,206,472 | 6/1980 | Chu et al. | 357/715 |
| 4,233,337 | 11/1980 | Friedmann et al. | 357/51 |
| 4,361,599 | 11/1982 | Wourms | 357/715 |
| 4,378,628 | 4/1983 | Levinstein et al. | 357/675 |
| 4,392,150 | 7/1983 | Courreges | 357/51 |
| 4,424,578 | 1/1984 | Miyamoto | 357/51 |
| 4,434,544 | 3/1984 | Dohya et al. | 29/578 |

OTHER PUBLICATIONS

Howard, "Gates for MOS Devices: Rare Earth Silicides," IBM Tech. Discl. Bull., vol. 21, No. 7, Dec. '78.
Ning, "Effect of Emmitter Contact on Current Gain of Silicon Bipolar Devices," IEEE Trans. of Electron Dev., vol. ED-27, Nov. 1980.
Sopher et al, "Metal Contacts to Semiconductor Devices", IBM Tech. Discl. Bull., vol. 10, No. 2, Jul. 1967.
IEDM Digest, Dec. 1981, pp. 54 to 57.
The Appl. Phys. Lett., vol. 39, Dec. 1981, pp. 900–902.
IEEE Trans. Elect. Dev., Sep. 1973, p. 840.
J. Electrochem. Soc., Feb. 1981, pp. 423–429.

Primary Examiner—Brian E. Hearn
Assistant Examiner—Hunter L. Auyang
Attorney, Agent, or Firm—Hill, Van Santen, Steadman & Simpson

[57] ABSTRACT

A method of manufacturing stable, low resistance contacts in an integrated semiconductor circuit which involves providing highly doped impurity diffused regions in a silicon substrate, forming a silicon dioxide layer over the highly doped diffused regions and the surrounding substrate, forming contact holes of uniform size in the silicon dioxide layer in selected areas of the highly doped diffused regions, applying a layer including a metal silicide into the holes in contact with the underlying highly doped diffused regions, applying an $n^+$-doped polysilicon layer into the contact holes and over the silicon dioxide layer with a thickness corresponding to about half the contact hole side length, and then depositing a layer of predominantly aluminum over the $n^+$-doped polysilicon layer.

9 Claims, 2 Drawing Figures

METHOD OF MANUFACTURING STABLE, LOW RESISTANCE CONTACTS IN INTEGRATED SEMICONDUCTOR CIRCUITS

BACKGROUND OF THE INVENTION

1. Field of the Invention

This invention is in the field of manufacturing stable, low resistance contacts in integrated semiconductor circuits employing a substrate of silicon with an interconnecting layer consisting of aluminum or an aluminum alloy which is connected to the diffused silicon regions of the circuit by means of an intermediate layer including a metal silicide.

2. Description of the Prior Art

In modern very large scale integrated circuits (VLSI) that are characterized by minimal structures of about 2 microns, the contacts between the aluminum interconnections and the monocrystalline or polycrystalline silicon regions situated below the interconnections are generally produced by forming contact holes which are etched in an insulating layer, for example, in an approximately 1 micron thick silicon dioxide layer. The interconnection pattern, usually consisting of aluminum having slight additions of silicon and copper, is then formed so that a direct contact between the metal and the doped silicon occurs in the contact hole.

With progressive miniaturization of the lateral structural dimensions, the penetration depth of the doped silicon regions to be contacted also usually becomes lower. With metal-oxide-semiconductor circuits (MOS) having 1 micron dimensions, it amounts to approximately 0.2 micron. On the other hand, there is a trend toward not reducing or only slightly reducing the thickness of the insulating layer and thus the depth of the contact holes so that parasitic capacitances can be kept as low as possible. For example, an insulation layer thickness of 1 micron can be desirable for MOS circuits having contact hole sizes of 1 micron.

As a result of these relationships in miniaturized circuits (low penetration depth, low contact hole area, deep contact holes) there arises a series of problems from the use of the aluminum contact known to the prior art, these problems being enumerated below with reference to an example of an n-channel MOS circuit.

(1) The film resistance of the diffused regions increases because of the lower penetration depth and degrades, for example, the transconductance of the MOS transistors.

(2) Silicon precipitation can occur in the contact holes when there is excess silicon in the aluminum. The precipitation results in an increased contact resistance when the dimensions of the contact holes become so small that they are on the order of the precipitated silicon crystallites or when the precipitated material epitaxially grows in the whole contact hole during subsequent heat treatments.

(3) With too low a silicon content in the aluminum, aluminum-silicon reactions occur in the contact hole. If the reaction zone extends locally down to the penetration depth of the diffused region, the pn-junction becomes shorted. This problem is intensified at low penetration depths.

(4) The electric current does not flow in the contact hole with uniform current density from the aluminum into the diffused region. On the contrary, current crowding that increases with a lower penetration depth of the diffused region occurs at the edge of the contact hole. This locally increased current density can lead to a material migration and to intense local heating in the contact hole area.

(5) With circuits having structures in the range of 1 micron, the aluminum interconnections must be etched with anisotropic etching methods in order to keep the underetching under the resist mask as slight as possible. Presently known anisotropic etching methods for aluminum such as plasma etching, reactive ion etching, and reactive ion beam etching, generally etch the silicon with a comparable etching rate or at least not with an etching rate that is lower by orders of magnitude. This leads to the result that the underlying silicon is also slightly eroded after the complete removal of the aluminum. With a low penetration depth of the diffused region, the region can be etched through down to the pn-junction whereby the electrical barrier properties of the pn-junction are degrated. Although it is in fact standard for aluminum interconnections in the circuits to completely cover the contact holes so that the described etching through a diffused region cannot occur, a single otherwise insignificant mask fault or somewhat too great an adjustment error when adjusting the aluminum mask can lead to the described effect and, potentially, to the failure of the overall circuit.

(6) Since the contact holes of miniaturized circuits can exhibit very low lateral dimensions (for example, 1 micron×1 micron) with a relatively great depth (for example, 1 micron) a greatly diminished metal coating in the contact hole and at the steep contact hole walls can occur during metal coating as a result of shadowing effects. This reduces the reliability of the circuits. The problem is even more serious where a multi-layer metallization is provided since, under certain conditions, each of the successive layers, metal layer and insulation layer, is affected by the problem.

The problems presented under items (1) and (3) can be eliminated or reduced by means of a silicide layer on the diffused regions, as discussed in an article by P. A. Gargini and I. Beinglass in the IEDM Digest, pages 54–57 (December 1981).

In connection with items (2), (3), (4) and (6), there is an article by S. Vaidya in the J. Appl. Phys. 39 (11), pages 900 to 902 (December 1981) wherein it is proposed to use a double layer of n+-doped polysilicon and aluminum instead of aluminum containing approximately 1% silicon.

The problem of greatly diminished metal coating in the contact hole referred to under item (6) can also be relieved by the formation of sloped contact hole walls as discussed, for example, in an article by R. A. Moline in IEEE Trans. Electron. Dev., ED-20, page 804 (1973).

SUMMARY OF THE INVENTION

The present invention seeks to eliminate all of the problems heretofore recognized and provides a method for manufacturing stable, low resistance contacts for VLSI circuits.

The invention relates to a method of manufacturing stable, low-resistance contacts in integrated circuits which has the following features:

(a) the diffused regions of the circuit which are provided for contacting are provided with contact holes of uniform size matched to the minimum dimensions of the circuit elements;

(b) a plurality of such uniform contact holes are provided where larger-area contacts are desired;

(c) the diffused regions in the contact hole region are covered with a metal silicide layer or with a metal/-metal silicide double layer;

(d) double layers consisting of n+-doped polysilicon and aluminum are employed as interconnections.

BRIEF DESCRIPTION OF THE DRAWINGS

A further description of the present invention will be made in connection with the attached sheet of drawings, in which.

DESCRIPTION OF THE PREFERRED EMBODIMENTS

Figure 1:
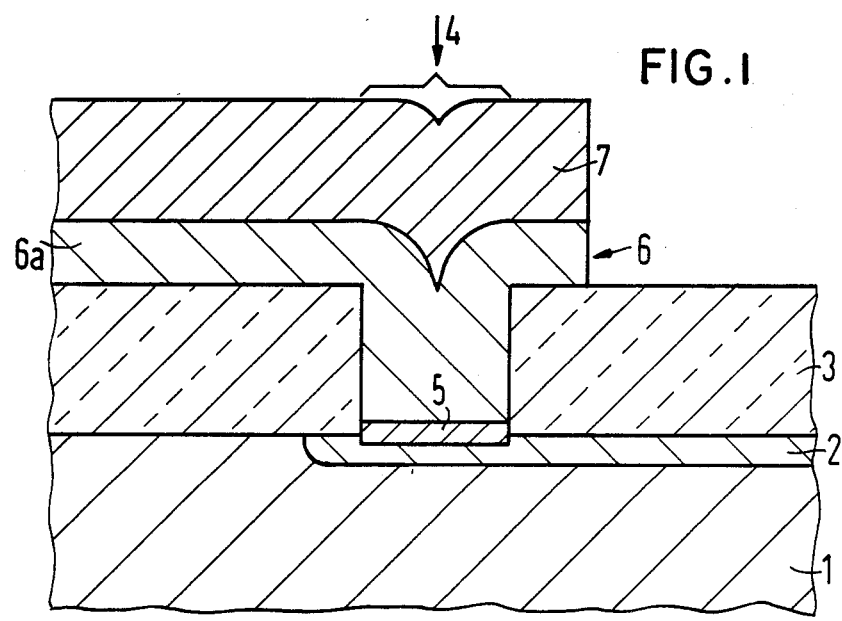
FIG. 1 is a greatly enlarged fragmentary cross-sectional view of an integrated circuit employing the improvements of the present invention.

In FIG. 1, reference numeral 1 indicates a silicon substrate containing an n+-doped or p+-doped region 2. Located above the highly doped region 2 is a layer of silicon dioxide 3 which contains a 1 micron×1 micron large contact hole formed therein indicated by the arrow 4. Using known methods, a silicide layer such as a platinum silicide layer 5 having a layer thickness of about 50 to 100 nm is deposited onto the contact hole region 4 of the highly doped region 2. Next, n+-doped polysilicon layer 6 is applied to the metal silicide layer by means of a low pressure vapor phase deposition. Suitable methods for applying the n+-doped polysilicon include low pressure chemical vapor deposition, a plasma-induced gas phase deposition, or a photochemically induced gas phase deposition. The deposition of the n+-doped polysilicon layer 6 is carried out such that the deposition rate is the same on horizontal and vertical parts of the surface. The thickness of the n+-doped polysilicon layer 6a above the contact hole 4 is such that it corresponds to approximately one-half the length of a side of the contact hole. It is important that under these conditions the contact hole 4 will be nearly completely filled with polysilicon 6 so that a nearly planar surface results. The thickness of the polysilicon layer 6a over the silicon dioxide layer 3 will normally be about 0.4 to 0.5 micron. Finally, a layer 7 composed predominantly of aluminum is vapor deposited in a layer thickness of about 1 micron. The aluminum layer may contain about 1 to 2% silicon and up to 6% by weight copper. The presence of the copper serves to improve the resistance against electromigration.

Figure 2:
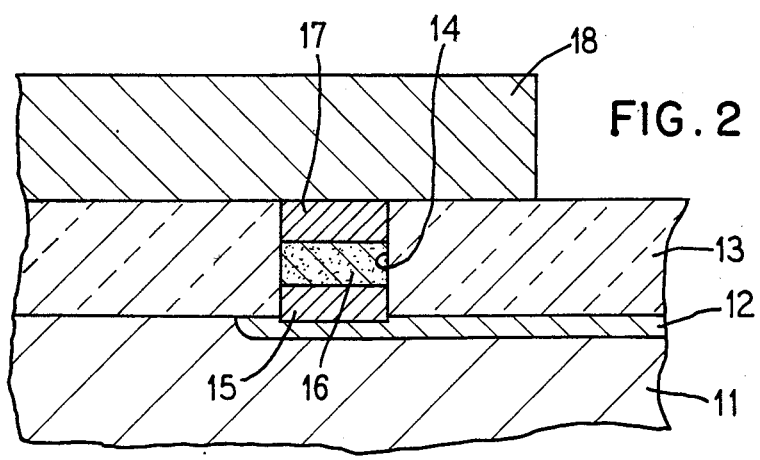
FIG. 2 is a greatly enlarged fragmentary cross-sectional view of a modified form of the invention.

The modified form of the invention shown in FIG. 2 includes a silicon substrate 11 on which there is formed a highly doped n+ or p+ layer 12. A layer of silicon dioxide 13 has a contact hole 14 formed therein. At the base of the contact hole 14 is a silicide layer which may be platinum silicide. Immediately above the silicide layer 15 there is a layer 16 of chromium-chromic oxide which acts as a barrier to prevent diffusion of the dopant from the n+-doped polysilicon layer 17 into the metal silicide layer 15.

In the form of the invention shown in FIG. 2, the n+-doped polysilicon layer 17 is back-etched to such a degree that only the contact hole 14 remains filled with the polysilicon 17. Finally, the aluminum or aluminum alloy layer 18 is applied as in the previous embodiment. The aluminum layer is deposited to a thickness of about 1 micron and after application of a photoresist mask, the interconnection pattern is defined by etching.

The method of the present invention provides satisfactory solutions to the six problems noted previously. Problem 1, dealing with the increase in film resistance of the diffused regions is overcome by means of the metal silicide layer 5. The second problem, that of silicon precipitation, is avoided by means of the polysilicon layer 6 under the aluminum layer 7. The aluminum-silicon reaction, problem 3, is prevented by means of the metal silicide layer 5 and the polysilicon layer 6 under the aluminum layer 7.

A more uniform current density is achieved because layers that have a significantly higher conductivity than the n+-doped polysilicon 6 are situated above and below the polysilicon layer 6 in the region of the contact hole 4. A nearly uniform current density distribution is obtained in the contact hole 4 as a result. Assuming a 1 micron deep contact hole having an area of 1 square micron, the resistance to vertical flow of current in the contact hole amounts to approximately 10 Ohms with an assumed specific resistance of polysilicon of $10^{-3}$ Ohm cm.

The problems of etching aluminum are reduced because when etching the polysilicon-aluminum double layer 6,7, etching down to the silicide layer 5 is avoided even with an incomplete coverage of the contact hole 4 by the etching mask because the polysilicon 6 in the contact hole 4 is significantly thicker than the polysilicon layer 6a to be etched through. There are no catastrophic consequences due to a local mask fault or a larger misadjustment of the mask even when these errors are nearly the same size as the contact hole dimension. Only the contact hole resistance becomes somewhat higher.

Finally, problems arising during metal coating are minimized as a result of the nearly planar surface in the region of the contact hole 4.

The method of the present invention is not only suitable for n-channel MOS circuits but is also fundamentally suited for CMOS and bipolar circuits wherein both n-doped and p-doped regions must be contacted.

The insulating layer (silicon dioxide in the example) may consist of a material having a lower temperature stability, for example, a polyimide which can withstand a maximum temperature of about 400° C. The method is applicable to such lower temperature materials when both the polysilicon coating as well as the activation of the dopant in the polysilicon (phosphorus or arsenic) takes place at temperatures below 400° C. or do not negatively affect the insulating layer. For example, this can be done by means of a plasma deposition of the polysilicon and a laser beam or electron beam activation of the dopant.

The method can also be applied to contact holes using a multi-layer metallization wherein contacts must be provided between aluminum interconnections from a first and second metallization level.

It is also possible to apply the known method for leveling layers such as disclosed in an article by Adams and Capio in the J. Electro-chem. Soc. 128, No. 2 (1981), pages 423-429, to the polysilicon layer before the aluminum coating is applied. In this procedure, the polysilicon is eroded surface-wise in a thickness which is somewhat greater than the polysilicon layer deposited on planar parts of the surface. After the erosion of the layer, the polysilicon remains only in the contact holes 4 which are nearly completely filled with polysilicon. As a result, a double layer no longer exists on the silicon dioxide regions, which becomes important for special etching problems.

It will be evident that various modifications can be made to the described embodiments without departing from the scope of the present invention.

We claim as our invention:

1. A method of manufacturing stable, low resistance contacts in an integrated semiconductor circuit which comprises:

providing highly doped diffused regions in a silicon substrate, forming a silicon dioxide layer over said highly doped diffused regions in the surrounding substrate, forming contact holes of uniform size in said silicon dioxide layer in selected areas of said highly doped diffused regions, said contact holes being matched to the minimum dimensions of the circuit elements, with a plurality of such uniform contact holes being provided in diffused regions of larger area, applying a layer including a metal silicide into said holes in contact with the underlying highly doped diffused region but insufficient to completely fill the contact holes, applying an $n^+$-doped polysilicon layer into the contact holes and over the silicon dioxide layer, the thickness of said $n^+$-doped layer above the contact holes being approximately one-half the length of a side of said contact holes, and depositing a layer of predominantly aluminum over the doped polysilicon layer.

2. A method according to claim 1 wherein said metal silicide is platinum silicide.

3. A method according to claim 1 wherein said aluminum layer contains from 1 to 2% silicon.

4. A method according to claim 3 wherein copper in an amount of up to 6% is also present in said aluminum layer.

5. A method according to claim 1 wherein:
said $n^+$-doped polysilicon layer is deposited at substantially the same rate on horizontal and vertical portions of the substrate surface.

6. A method according to claim 5 wherein:
said $n^+$-doped polysilicon is deposited by means of a low pressure vapor phase deposition.

7. A method according to claim 5 wherein:
said $n^+$-doped polysilicon is deposited by means of a plasma induced vapor phase deposition.

8. A method according to claim 5 wherein:
said $n^+$-doped polysilicon is deposited by means of a photochemically induced vapor phase deposition.

9. A method according to claim 1 wherein the $n^+$-doped polysilicon layer is back-etched so that only the contact holes remain filled with polysilicon.

* * * * *